United States Patent
Yamamoto et al.

(10) Patent No.: US 8,038,816 B2
(45) Date of Patent: Oct. 18, 2011

(54) METHOD AND APPARATUS FOR SEPARATING PROTECTIVE TAPE FROM SEMICONDUCTOR WAFER

(75) Inventors: Masayuki Yamamoto, Ibaraki (JP); Yukitoshi Hase, Kameyama (JP)

(73) Assignee: Nitto Denko Corporation, Osaka (JP)

( * ) Notice: Subject to any disclaimer, the term of this patent is extended or adjusted under 35 U.S.C. 154(b) by 60 days.

(21) Appl. No.: 12/630,638

(22) Filed: Dec. 3, 2009

(65) Prior Publication Data

US 2010/0147442 A1   Jun. 17, 2010

(30) Foreign Application Priority Data

Dec. 11, 2008   (JP) ................ 2008-315537

(51) Int. Cl.
*B32B 38/00* (2006.01)
*B32B 41/00* (2006.01)
(52) U.S. Cl. .......... 156/64; 156/249; 156/250; 156/256; 156/267
(58) Field of Classification Search .......... 156/64, 156/249, 250, 256, 267
See application file for complete search history.

(56) References Cited

U.S. PATENT DOCUMENTS

| | | | |
|---|---|---|---|
| 7,060,154 B2 | 6/2006 | Yamamoto et al. | |
| 7,723,211 B2 * | 5/2010 | Yamamoto et al. | 438/462 |
| 7,876,432 B2 * | 1/2011 | Yamamoto et al. | 356/237.5 |
| 2003/0092288 A1 * | 5/2003 | Yamamoto et al. | 438/800 |
| 2005/0062960 A1 * | 3/2005 | Tsuji et al. | 356/237.2 |
| 2009/0009755 A1 * | 1/2009 | Yamamoto et al. | 356/237.5 |
| 2009/0011525 A1 * | 1/2009 | Yamamoto et al. | 438/7 |

FOREIGN PATENT DOCUMENTS

JP   2002-124494 A   4/2002

* cited by examiner

*Primary Examiner* — George Koch
(74) *Attorney, Agent, or Firm* — Cheng Law Group, PLLC

(57) ABSTRACT

A method of this invention involves capturing an image of an outer periphery of a semiconductor wafer, by use of a CCD camera, performing image analysis on data about the captured image, detecting defects such as chips and cracks on the outer periphery of the semiconductor wafer, storing positions of the respective defects, calculating a clearance between the adjacent defects from information about the stored positions, comparing the calculated clearances with a preset width of a separation tape, and obtaining the clearance larger than the width of the separation tape, by arithmetic processing. If some of the clearances are larger than the width of the separation tape, this method also involves setting an appropriate one of the clearance as a position where the separation tape is joined, performing alignment on the semiconductor wafer, joining the separation tape to a protective tape joined to a surface of the semiconductor wafer, and separating the protective tape together with the separation tape from the surface of the semiconductor wafer.

8 Claims, 5 Drawing Sheets

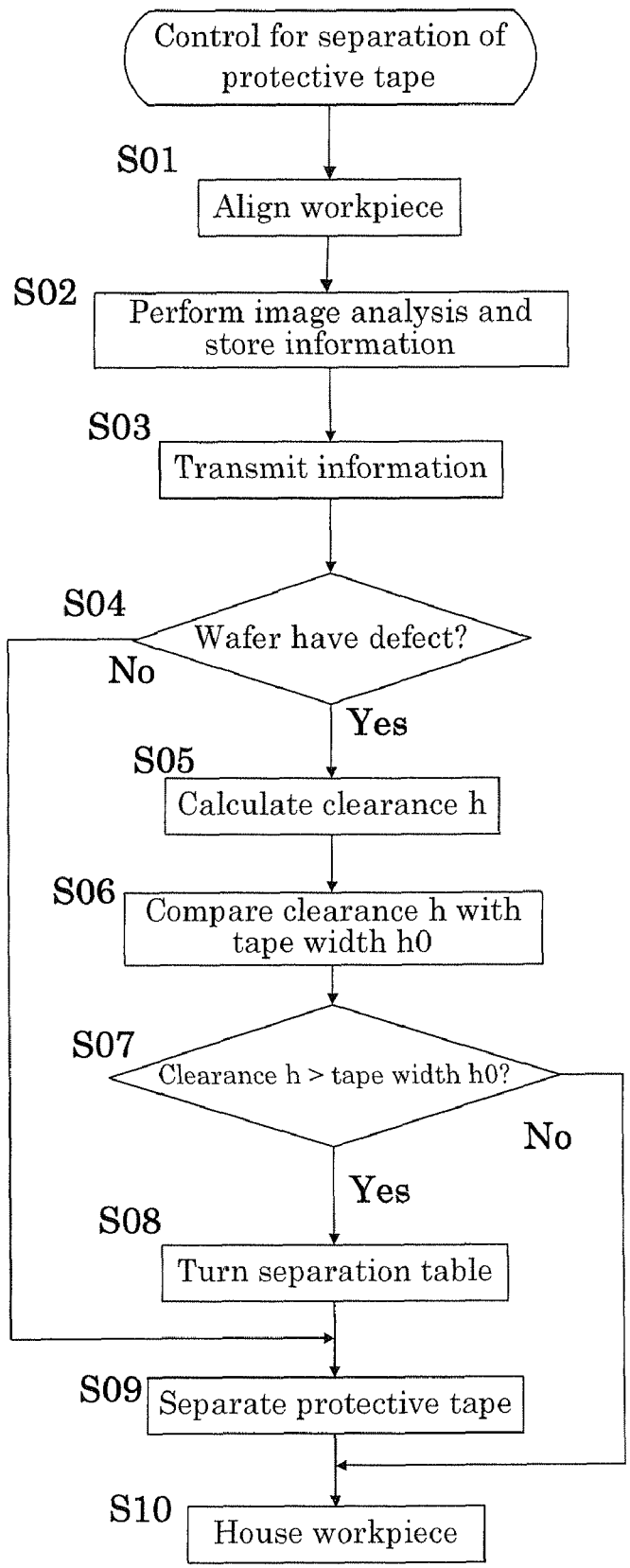

METHOD AND APPARATUS FOR SEPARATING PROTECTIVE TAPE FROM SEMICONDUCTOR WAFER

BACKGROUND OF THE INVENTION

1. Field of the Invention

The present invention relates to a method and an apparatus for joining, to a protective tape joined to a surface of a semiconductor wafer, a separation tape having a width narrower than a diameter of the semiconductor wafer to separate the protective tape together with the separation tape from the surface of the semiconductor wafer.

2. Description of the Related Art

Conventionally, a chip component has been manufactured from a semiconductor wafer (hereinafter, appropriately referred to as a "wafer") in accordance with the following procedure.

As disclosed in JP2002-124494A, for example, a circuit pattern is formed on a surface of a wafer, and then a protective tape is joined to the surface of the wafer. Thereafter, a back grinding process is performed on a rear face of the wafer in order to thin the wafer. The thinned wafer is held by a ring frame through a dicing tape. In this state, the protective tape is separated from the surface of the wafer. Thereafter, a dicing process is performed on the wafer.

In the case where the protective tape is separated from the thinned wafer, the wafer is frequently damaged from a stress to be applied thereto when the protective tape is joined thereto or separated therefrom, because of reduction in strength. In the back grinding process, particularly, such a stress causes further growth of a defect such as a chip or a crack on an outer periphery of the wafer, resulting in increase of the damage. If the wafer is further damaged by the growth of the defect and, consequently, the protective tape can not be separated from the wafer because of the damage, the wafer is discarded before being subjected to the dicing process.

For this reason, all the chip components including usable non-defectives are discarded, so that there arises a problem of reduction in yield.

SUMMARY OF THE INVENTION

The present invention is directed to appropriately separate a protective tape from a semiconductor wafer while preventing further growth of a defect such as a chip or a crack on an outer periphery of the semiconductor wafer.

Additional features of the present invention will be set forth in the description which follows, and in part will be apparent from the description, or may be learned by practice of the invention.

The present invention discloses a method for joining, to a protective tape joined to a surface of a semiconductor wafer, a separation tape having a width narrower than a diameter of the semiconductor wafer to separate the protective tape together with the separation tape from the surface of the semiconductor wafer.

This method includes: detecting defects on an outer periphery of a semiconductor wafer, and storing positions of the respective defects; calculating a clearance between the adjacent defects from information about the stored positions, comparing the calculated clearances with a width of a separation tape, and obtaining the clearance larger than the width of the separation tape; and setting the clearance as a position for starting to join the separation tape, and joining the separation tape to the clearance and separating the separation tape from the clearance.

According to this method, it is possible to start to join the separation tape at the portion where neither a chip nor a crack is generated. Thus, it is possible to separate the protective tape together with the separation tape from the surface of the semiconductor wafer while preventing a chip or a crack on the semiconductor wafer from being further developed because of a stress to be applied to the semiconductor wafer when the protective tape is separated from the semiconductor wafer or a stress to be applied to the semiconductor wafer when the semiconductor wafer is pressed with a tape guide member.

In the method described above, preferably, the joining of the separation tape is started at a largest portion in the calculated clearance.

For example, the defect is detected by: acquiring information about a wafer outer peripheral area covering an alignment mark formed on the semiconductor wafer or information about the entire semiconductor wafer, by use of a sensor; and converting a portion to be assumed as the defect into a coordinate, and matching the coordinate to reference coordinate information about a non-defective semiconductor wafer having only an alignment mark formed thereon to obtain a portion excluding the alignment mark.

In particular, when some of the clearances are larger than the width of the separation tape, a largest one of the clearances is set as a separation start position.

Moreover, the largest clearance is obtained by: converting the defects on the outer periphery of the semiconductor wafer into coordinates, respectively, and obtaining a linear distance between the coordinates of the adjacent defects; comparing the linear distances with the width of the separation tape to extract the linear distance larger than the width of the separation tape, and obtaining a midpoint coordinate on a line corresponding to the linear distance; obtaining a center line connecting between the midpoint coordinate and a center coordinate of the semiconductor wafer; obtaining linear distances between the center line and all the coordinates of each defect, the linear distances being perpendicular to the center line; and obtaining a portion where all the distances between the coordinates of the defects opposed to each other with the center line located therebetween are larger than the width of the separation tape, and setting the portion as the separation start position.

According to the method described above, a further growth of a chip or a crack on a semiconductor wafer may be suppressed.

Moreover, even when a semiconductor wafer has a defect such as a chip or a crack, non-defective chip components can be obtained from a portion where no defect is generated as long as a protective tape can be separated from the semiconductor wafer.

The present invention also discloses an apparatus for joining, to a protective tape joined to a surface of a semiconductor wafer, a separation tape having a width narrower than a diameter of the semiconductor wafer to separate the protective tape together with the separation tape from the surface of the semiconductor wafer.

This apparatus includes: a separation table that holds a semiconductor wafer placed thereon in a state that a protective tape is joined to a surface of the semiconductor wafer; a tape separating mechanism that joins, to the surface of the semiconductor wafer placed on and held by the separation table, a separation tape having a width narrower than a diameter of the semiconductor wafer, in a radial direction of the semiconductor wafer, and separates the protective tape together with the separation tape from the surface of the semiconductor wafer; a wafer monitoring mechanism that monitors an outer periphery of the semiconductor wafer placed on and held by the separation table to detect defects; and a control device that stores positions of the detected defects in a circumferential direction of the semiconductor wafer, calculates a clearance between the adjacent defects, obtains a clearance larger than the width of the separation tape, and sets the clearance as a position where the tape separating mechanism starts to join the separation tape.

According to this apparatus, it is possible to suitably implement the method described above.

It is to be understood that both the foregoing general description and the following detailed description are exemplary and explanatory and are intended to provide further explanation of the present invention as claimed.

BRIEF DESCRIPTION OF THE DRAWINGS

The accompanying drawings, which are included to provide a further understanding of the present invention are incorporated in and constitute a part of this specification, illustrate embodiments of the invention, and together with the description serve to explain the principles of the invention.

FIG. 6 shows a flowchart of a procedure for separating the protective tape.

DESCRIPTION OF THE PREFERRED EMBODIMENTS

Figure 1:
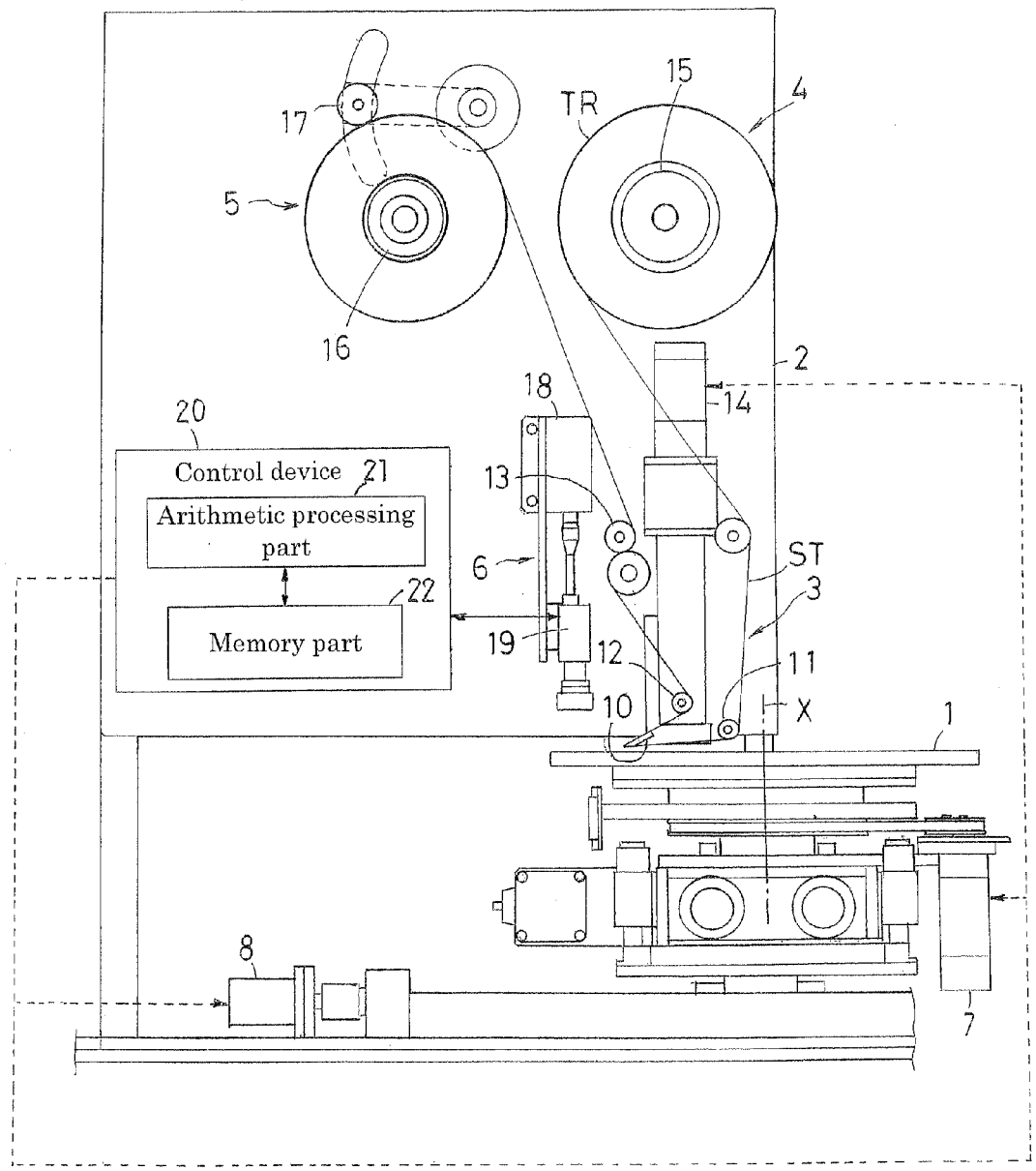
FIG. 1 shows a front view of a protective tape separating apparatus.

The present invention is described more fully hereinafter with reference to the accompanying drawings, in which embodiments of the invention are shown. The invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

One exemplary embodiment of the present invention will be described in detail hereinafter with reference to the drawings.

Figure 2:
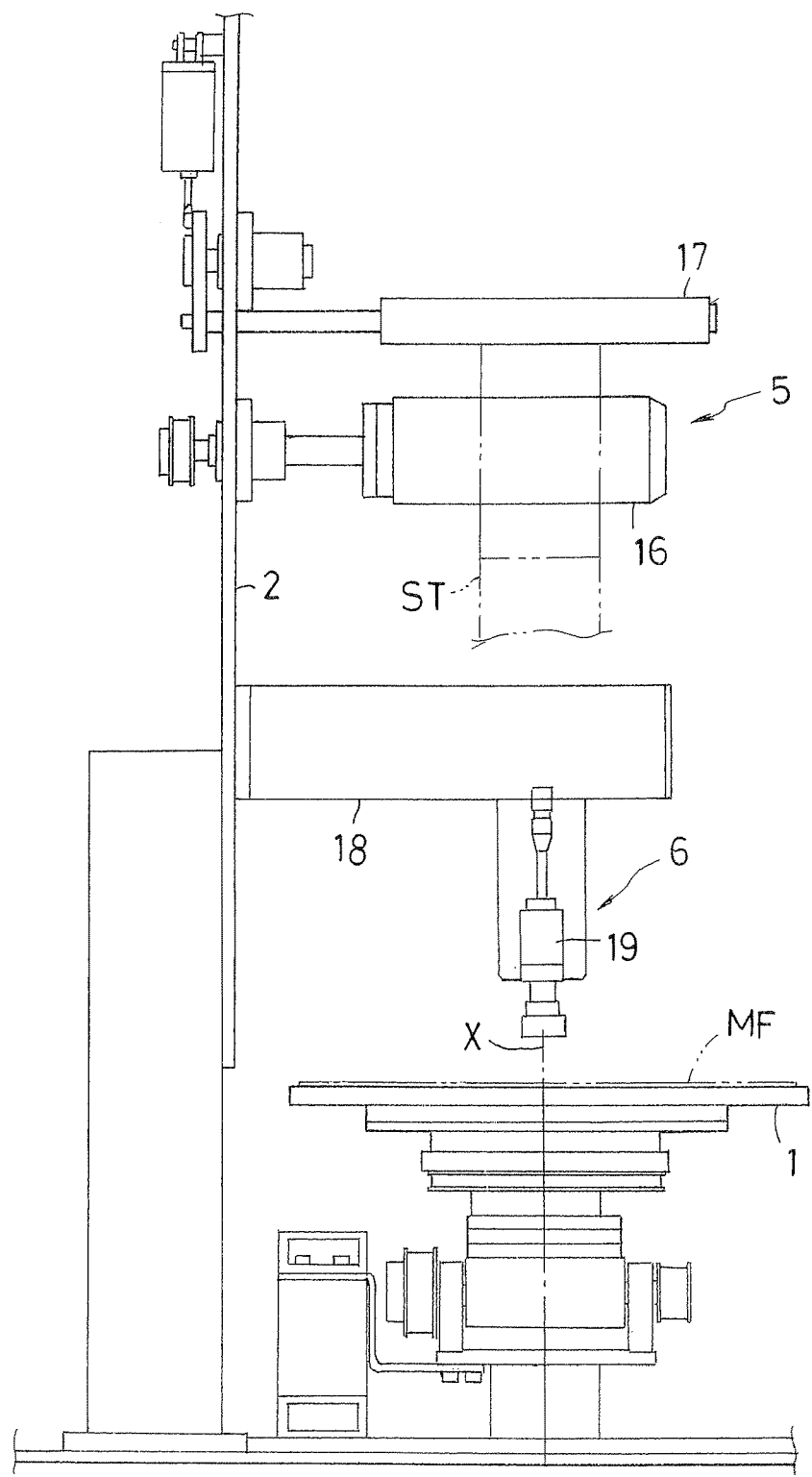
FIG. 2 shows a side view of the protective tape separating apparatus.

FIG. 1 shows a front view of a protective tape separating apparatus that implements a method according to the present invention. FIG. 2 shows a side view of the protective tape separating apparatus.

The protective tape separating apparatus includes a separation table 1 on which a workpiece is placed. The separation table 1 can rotate about a vertical axis X passing a center thereof. The protective tape separating apparatus also includes a vertical wall-shaped support frame 2 disposed upright at a rear side of the separation table 1. The support frame 2 is provided with a tape separating mechanism 3, a separation tape supplying section 4, a tape collecting section 5 and a wafer monitoring mechanism 6.

Figure 3:
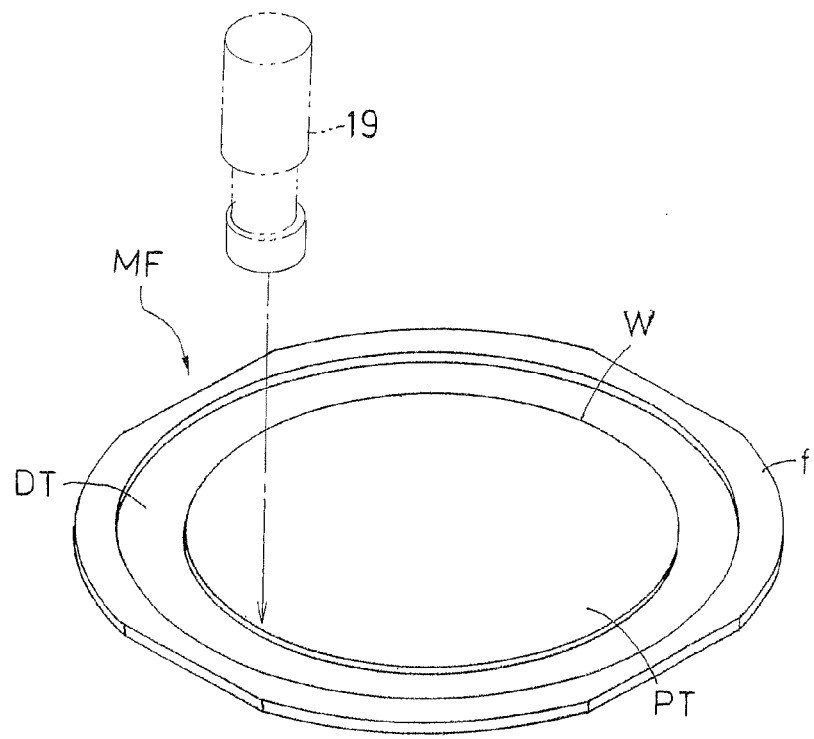
FIG. 3 shows a perspective view of a mount frame.

As shown in FIG. 3, the workpiece to be placed on the separation table 1 corresponds to a mount frame MF. The mount frame MF includes a semiconductor wafer (hereinafter, simply referred to as a wafer) W and a ring frame f for holding the wafer W through a dicing tape DT. Herein, the wafer W is subjected to a back grinding process in a state that a transparent protective tape PT is joined to a surface thereof on which a circuit pattern is formed. The mount frame MF is suction-held by the separation table 1 in a state that a center of the wafer W is aligned with the vertical axis X shown in FIG. 1.

The separation table 1 is driven by a motor 7 and a belt wound around the motor 7 to rotate about the vertical axis X. Further, the separation table 1 is driven by a motor 8 to move horizontally in a screw-feed manner.

The tape separating mechanism 3 includes a plate-like joining member 10 having a wide and sharp tip end, a supply guide roller 11 for guiding a separation tape ST fed out from the separation tape supplying section 4 to the joining member 10, a collection guide roller 12 for guiding the separation tape ST folded back at the tip end of the joining member 10, a feed roller 13, and the like. The joining member 10, the supply guide roller 11 and the collection guide roller 12 are configured in a unit form, and a cylinder 14 allows this unit to move vertically.

The separation tape supplying section 4 includes a master roll TR of the separation tape ST, and a supply shaft 15 attached to a front side of the support frame 2 in a horizontally cantilever manner. The separation tape ST has a width which is narrower than a diameter of the wafer W.

The tape collecting section 5 includes a collection shaft 16 attached to the front side of the support frame 2 in a horizontally cantilever manner. The collection shaft 16 winds the separation tape ST fed by the feed roller 13 and the protective tape PT integrated with the separation tape ST. The tape collecting section 5 also includes a pressure roller 17 capable of moving swinging.

The pressure roller 17 guides the separation tape ST while pressing an outer periphery of the separation tape ST, in order to prevent the separation tape ST from being collected irregularly.

The wafer monitoring mechanism 6 includes a support arm 18 attached to the front side of the support frame 2 in a cantilever manner, and a CCD camera 19 attached to the support arm 18 and directed downward. The CCD camera 19 captures an image of an outer periphery of the wafer W placed on the separation table 1.

The motor 7 that allows the separation table 1 to rotate, the motor 8 that allows the separation table 1 to move horizontally, the cylinder 14 that allows the tape separating mechanism 3 to move vertically, and the CCD camera 19 are connected to a control device 20 for controlling operations thereof. This control will be described later.

With reference to a flowchart of FIG. 6, next, description will be made of a procedure for separating the protective tape PT from the surface of the wafer W in the protective tape separating apparatus.

First, the mount frame (the workpiece) MF is prepared as follows. That is, the wafer W is subjected to the back grinding process in the state that the transparent protective tape PT is joined to the surface thereof on which the circuit pattern is formed, and then is held by the ring frame f through the dicing tape DT. This mount frame MF is supplied onto the separation table 1 by an appropriate handling device.

In step S01, the separation table 1 suction-holds the mount frame MF in the state that the center of the wafer W is aligned with the vertical axis X.

Next, the control device 20 allows the separation table 1 to rotate in a predetermined direction. Simultaneously, the CCD camera 19 of the wafer monitoring mechanism 6 successively captures an image of the outer periphery of the wafer W.

In step S02, an arithmetic processing part 21 of the control device 20 (see FIG. 1) performs an image analyzing process based on data about the captured image (image data) to detect a notch for alignment, a defect such as a chip or a crack, a size of the defect, a position of the defect in a circumferential direction of the wafer W (i.e., a phase angle relative to a reference position), and the like. Then, a memory part 22 of the control device 20 (see FIG. 1) stores information about the results of detection.

In step S03, next, the control device 20 transmits the information for use in a subsequent process (e.g., a dicing process).

Figure 5:
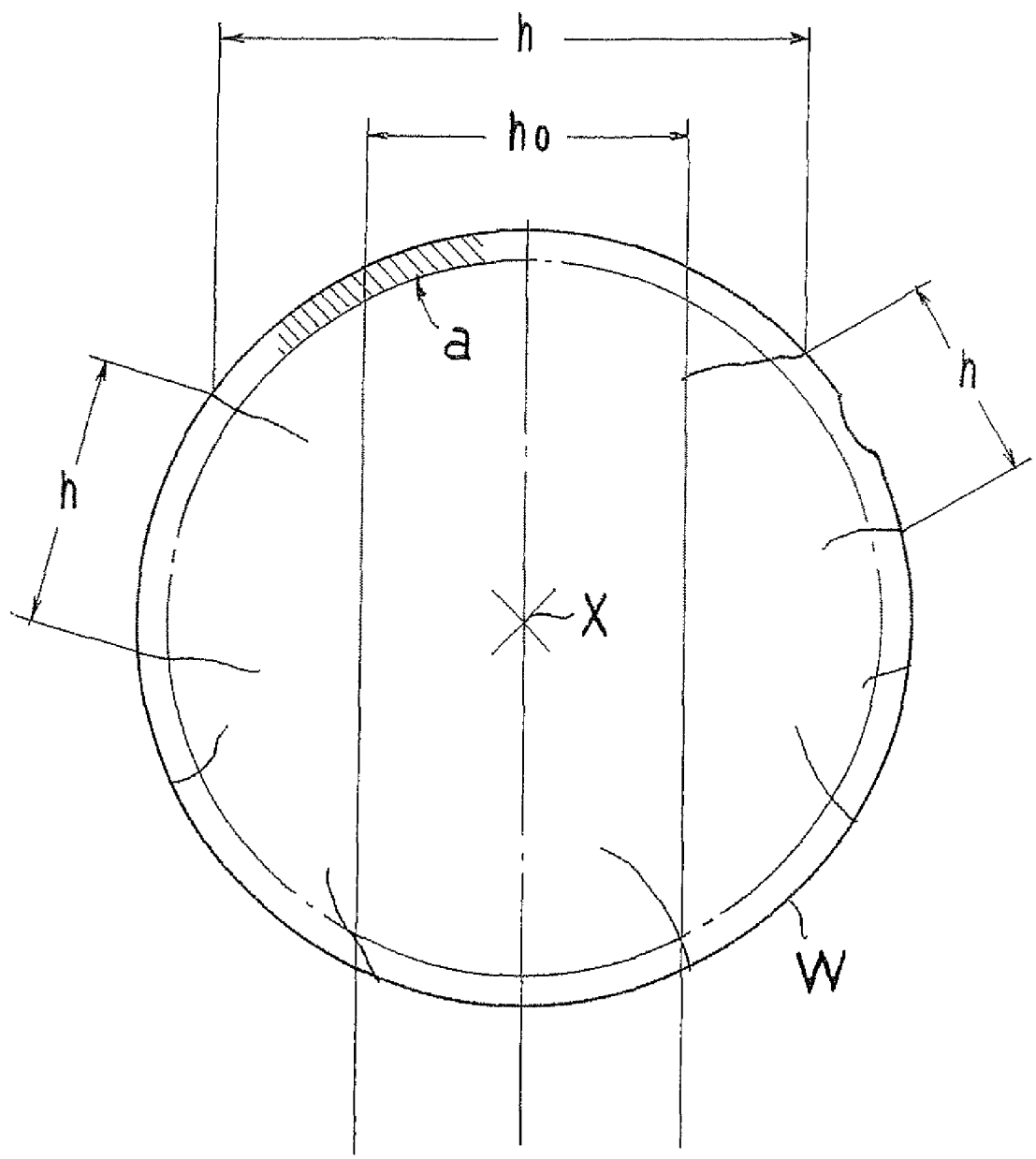
FIG. 5 shows a plan view of a semiconductor wafer having a defect.

As shown in FIG. 5, an image capturing area a of the CCD camera 19 is not particularly limited as long as it covers an alignment mark such as a notch for alignment. In other words, the image capturing area a is set within a range between 2 mm and 3 mm from an outer peripheral edge of a wafer W, as an area covering a rated notch.

In step S04, next, the control device 20 performs an imaging process to determine whether the wafer W has a defect. For example, the control device 20 matches the acquired image data about the outer periphery of the wafer W to be inspected to image data about an outer periphery of a non-defective wafer (reference coordinate information). The reference coordinate information is acquired in advance in such a manner that the CCD camera 19 captures an image of the outer periphery of the non-defective wafer. By this matching, the control device 20 discriminates a notch from a chip or a crack.

If the wafer W has no defect (No in step S04), the procedure immediately proceeds to step S09. In step S09, as will be described later, the tape separating mechanism 3 joins the separation tape ST to the protective tape PT joined to the wafer W subjected to alignment based on the notch, and then separates the protective tape PT together with the separation tape ST from the surface of the wafer W.

Thereafter, the procedure proceeds to step S10. In step S10, the mount frame MF, from which the protective tape PT is separated in step S09, is transferred from the separation table 1, and then is housed in a cassette or the like.

On the other hand, if the wafer W has defects (Yes in step S04), the procedure proceeds to step S05. As shown in FIG. 5, in step S05, the arithmetic processing part 21 sequentially calculates a clearance h between the adjacent defects along the circumferential direction of the wafer W, from the information stored in the memory part 22. In order to calculate the clearance h, for example, the arithmetic processing part 21 converts positions of the two defects on the outer periphery of the wafer W into coordinates based on the image data to calculate a linear distance between two address points. The memory part 22 stores the calculated clearance h.

In step S06, next, the control device 20 compares each clearance h calculated in step S05 with the preset width h0 of the separation tape ST.

In step S07, next, the control device 20 determines how many clearances h are larger than the width h0 of the separation tape ST. If all the clearances h are smaller than the width h0 of the separation tape ST (No in step S07), the control device 20 recognizes the wafer W as a defective wafer from which the protective tape PT can not be separated by use of the separation tape ST. Thereafter, the procedure proceeds to step S10.

On the other hand, if one of the clearances h is larger than the width h0 of the separation tape ST (Yes in step S07), the control device 20 recognizes the clearance h as a position for suitably starting to join the separation tape ST. Thereafter, the procedure proceeds to step S08.

In step S08, next, the control device 20 allows the separation table 1 to rotate such that this position is set as a position for starting to separate the protective tape PT.

Moreover, if some of the clearances h are larger than the width h0 of the separation tape ST (Yes in step S07), the arithmetic processing part 21 finds the largest clearance h from the clearances h by comparison, and recognizes the largest clearance h as the position for suitably starting to join the separation tape ST.

In step S09, next, the tape separating mechanism 3 joins the separation tape ST to the clearance h on the wafer W, and then separates the protective tape PT together with the separation tape ST from the wafer W. Thereafter, the procedure proceeds to step S10.

Figure 4:
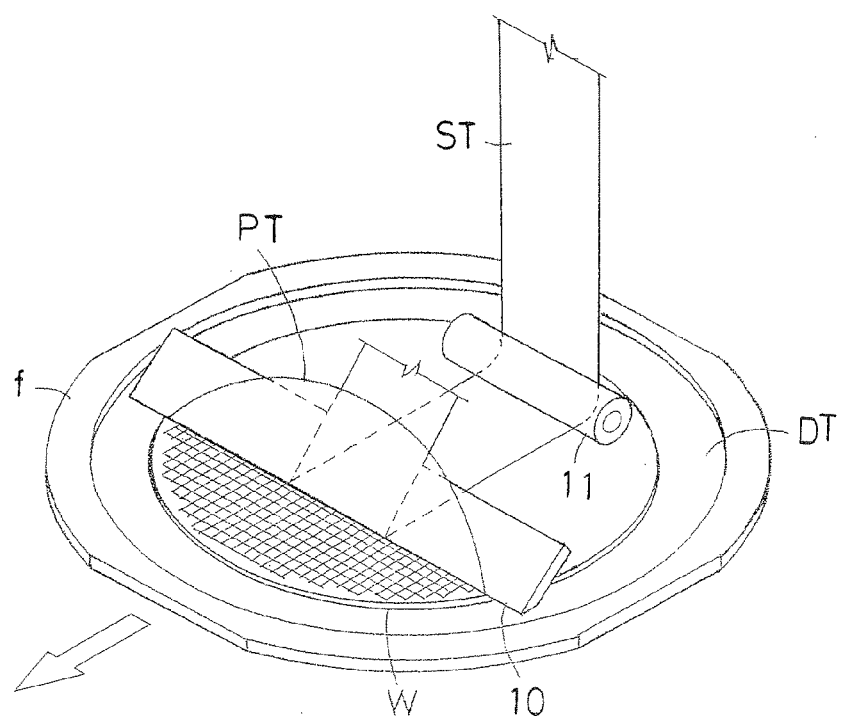
FIG. 4 shows a perspective view of a process of separating a protective tape.

In step S09, more specifically, the protective tape PT is separated from the wafer W as follows. First, the tape separating mechanism 3 moves downward with the tip end of the joining member 10 opposed to the outer peripheral edge of the wafer W to join the separation tape ST to an outer peripheral end of the protective tape PT. In this state, the separation table 1 moves forward, and the feed roller 13 feeds out the separation tape ST toward the tape collecting section 5 in synchronization with the moving speed of the separation table 1. In accordance with the feed of the separation tape ST, the protective tape PT, to which the separation tape ST is joined, is separated from the surface of the wafer W as shown in FIG. 4. The tape collecting section 5 winds and collects the protective tape PT together with the separation tape ST.

The present invention is not limited to only the exemplary embodiment described above, and may be embodied in accordance with the following modifications.

In the exemplary embodiment described above, the CCD camera 19 captures an image of only the outer periphery of the wafer W. Alternatively, the CCD camera 19 may capture an image of the entire wafer W in order to find an optimal portion as the position for starting to join the separation tape ST from data about the captured image. However, the following method can be applied to the case where the CCD camera 19 captures the image of only the outer periphery of the wafer W.

For example, in a case where a defect is a crack extending from an outer periphery toward a center in a wafer, the arithmetic processing part 21 converts all the cracks into coordinates. Then, the arithmetic processing part 21 obtains a coordinate of an outer peripheral end of each crack, and obtains a linear distance between the coordinates of the adjacent cracks. When the linear distance is larger than the width h0 of the separation tape ST, the arithmetic processing part 21 obtains a midpoint coordinate of a line corresponding to the linear distance. Then, the arithmetic processing part 21 obtains a center line connecting between the midpoint coordinate and a center coordinate of the wafer W. Further, the arithmetic processing part 21 obtains linear distances between all the coordinates of each crack and the center line. Herein, a line corresponding to each linear distance is perpendicular to the center line. The arithmetic processing part 21 may recognize, as the separation start position, a position where all the distances (widths) between the coordinates of the adjacent cracks opposed to each other with the center line located therebetween are larger than the width h0 of the separation tape ST. In other words, at this position, the separation tape ST is joined to the clearance between the adjacent cracks without contact with the crack.

In the exemplary embodiment described above, moreover, the stationary wafer monitoring mechanism 6 monitors the defect on the rotating wafer W. Alternatively, the wafer monitoring mechanism 6 may move along the outer periphery of the stationary wafer W.

In the exemplary embodiment described above, further, upon separation of the protective tape PT, the tape separating mechanism 3 moves downward to reach the predetermined position, and then the separation table 1 moves horizontally with respect to the stationary tape separating mechanism 3. Alternatively, the tape separating mechanism 3 may move horizontally at the predetermined position with respect to the stationary separation table 1.

In the exemplary embodiment described above, furthermore, the wafer monitoring mechanism 6 includes the CCD camera 19. Alternatively, the wafer monitoring mechanism 6 may employ a ultrasonic sensor, an optical sensor or an infrared sensor that allows detection of an alignment mark, a chip and a crack on the wafer W.

It will be apparent to those skilled in the art that various modifications and variations can be made in the present invention without departing from the spirit or scope of the invention. Thus, it is intended that the invention cover the modifications and variations of the invention provided they come within the scope of the appended claims and their equivalents.

What is claimed is:

1. A method for joining, to a protective tape joined to a surface of a semiconductor wafer, a separation tape having a width narrower than a diameter of the semiconductor wafer to separate the protective tape together with the separation tape from the surface of the semiconductor wafer, the method comprising:
detecting defects on an outer periphery of a semiconductor wafer, and storing positions of the respective defects;
calculating a clearance between the adjacent defects from information about the stored positions, comparing the calculated clearances with a width of a separation tape, and obtaining the clearance larger than the width of the separation tape; and
setting the clearance as a position for starting to join the separation tape, and joining the separation tape to the clearance and separating the separation tape from the clearance.

2. The method according to claim 1, wherein
the joining of the separation tape is started at a largest portion in the calculated clearance.

3. The method according to claim 1, wherein
the defect is detected by:
acquiring information about a wafer outer peripheral area covering an alignment mark formed on the semiconductor wafer, by use of a sensor; and
converting a portion to be assumed as the defect into a coordinate, and matching the coordinate to reference coordinate information about a non-defective semiconductor wafer having only an alignment mark formed thereon to obtain a portion excluding the alignment mark.

4. The method according to claim 3, wherein
when some of the clearances are larger than the width of the separation tape, a largest one of the clearances is set as a separation start position.

5. The method according to claim 4, wherein
the largest clearance is obtained by:
converting the defects on the outer periphery of the semiconductor wafer into coordinates, respectively, and obtaining a linear distance between the coordinates of the adjacent defects;
comparing the linear distances with the width of the separation tape to extract the linear distance larger than the width of the separation tape, and obtaining a midpoint coordinate on a line corresponding to the linear distance;
obtaining a center line connecting between the midpoint coordinate and a center coordinate of the semiconductor wafer;
obtaining linear distances between the center line and all the coordinates of each defect, the linear distances being perpendicular to the center line; and
obtaining a portion where all the distances between the coordinates of the defects opposed to each other with the center line located therebetween are larger than the width of the separation tape, and setting the portion as the separation start position.

6. The method according to claim 1, wherein
the defect is detected by:
acquiring information about the entire semiconductor wafer, by use of a sensor; and
converting a portion to be assumed as the defect into a coordinate, and matching the coordinate to reference coordinate information about a non-defective semiconductor wafer having only an alignment mark formed thereon to obtain a portion excluding the alignment mark.

7. The method according to claim 6, wherein
when some of the clearances are larger than the width of the separation tape, a largest one of the clearances is set as a separation start position.

8. The method according to claim 7, wherein
the largest clearance is obtained by:
converting the defects on the outer periphery of the semiconductor wafer into coordinates, respectively, and obtaining a linear distance between the coordinates of the adjacent defects;
comparing the linear distances with the width of the separation tape to extract the linear distance larger than the width of the separation tape, and obtaining a midpoint coordinate on a line corresponding to the linear distance;
obtaining a center line connecting between the midpoint coordinate and a center coordinate of the semiconductor wafer;
obtaining linear distances between the center line and all the coordinates of each defect, the linear distances being perpendicular to the center line; and
obtaining a portion where all the distances between the coordinates of the defects opposed to each other with the center line located therebetween are larger than the width of the separation tape, and setting the portion as the separation start position.

* * * * *